United States Patent
Ramachanthiran et al.

(10) Patent No.: US 12,267,971 B2
(45) Date of Patent: Apr. 1, 2025

(54) SELF-ALIGNING AND SELF-ORIENTATING SWIVEL LOCK MECHANISM FOR DESKTOP MONITORS

(71) Applicant: Dell Products L.P., Round Rock, TX (US)

(72) Inventors: Surendran Ramachanthiran, Singapore (SG); Ghee Beng Ooi, Singapore (SG); Fong Tien Chee, Singapore (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/966,992

(22) Filed: Oct. 17, 2022

(65) Prior Publication Data

US 2024/0125424 A1    Apr. 18, 2024

(51) Int. Cl.
*H05K 5/02* (2006.01)
*E05C 19/02* (2006.01)

(52) U.S. Cl.
CPC ......... *H05K 5/0234* (2013.01); *E05C 19/022* (2013.01); *F16M 2200/024* (2013.01); *F16M 2200/08* (2013.01)

(58) Field of Classification Search
CPC ........... F16M 11/105; F16M 2200/024; F16M 2200/08; H05K 5/0234; G06F 1/1601; G06F 1/1605; G06F 1/1607; Y10S 292/04; E05C 19/02; E05C 19/022
See application file for complete search history.

(56) References Cited

U.S. PATENT DOCUMENTS

| 4,547,027 | A | * | 10/1985 | Scheibenreif | .......... | F16M 11/10 248/921 |
| 4,591,120 | A | * | 5/1986 | Bryant-Jeffries | ...... | F16M 11/14 248/921 |
| 4,917,416 | A | * | 4/1990 | Westphal | .................. | E05C 1/04 292/DIG. 47 |
| 5,243,434 | A | * | 9/1993 | Nodama | ................ | F16M 11/18 348/827 |
| 6,958,902 | B2 | * | 10/2005 | Tseng | ...................... | G06F 1/162 361/679.06 |

(Continued)

FOREIGN PATENT DOCUMENTS

CN    106061331 B    2/2021

*Primary Examiner* — Muhammad Ijaz
*Assistant Examiner* — Guang H Guan
(74) *Attorney, Agent, or Firm* — Zagorin Cave LLP

(57) ABSTRACT

A monitor stand provides a self-aligning and self-orientating swivel lock mechanism for desktop monitors so the monitor stand can be easily locked at the center position to provide better user experience and easier manufacturing. A base of a monitor stand has a die cast plate and a swivel plate attached thereto to allow the monitor stand to rotate from the center position. A lock plunger of a swivel lock mechanism travels along a circular guided cam profile on the swivel plate when the swivel lock mechanism is engaged and the monitor stand is rotated. When the swivel lock mechanism rotates to the center position, a recessed portion of the circular guided cam profile receives the lock plunger of the swivel lock mechanism to thereby lock the swivel plate at the center position. The user engages/disengages the swivel lock mechanism by pushing an engagement button that extends from the base.

13 Claims, 21 Drawing Sheets

(56) References Cited

U.S. PATENT DOCUMENTS

| | | | |
|---|---|---|---|
| 7,503,532 B2* | 3/2009 | Sim | G06F 1/1601 |
| | | | 248/920 |
| 7,644,903 B2* | 1/2010 | Amato | F16M 11/08 |
| | | | 108/94 |
| RE42,091 E | 2/2011 | Moscovitch et al. | |
| 7,984,889 B2* | 7/2011 | Whitley | F16M 11/16 |
| | | | 248/222.12 |
| 8,979,048 B2* | 3/2015 | Tschann | F16M 11/08 |
| | | | 403/345 |
| 9,220,358 B2 | 12/2015 | Wheeler et al. | |
| 9,671,058 B2* | 6/2017 | Wang | F16M 11/24 |
| 9,746,128 B2 | 8/2017 | Huang | |
| 10,342,636 B2* | 7/2019 | Nowatschin | B25J 9/06 |
| 2021/0080217 A1* | 3/2021 | Richards | F16M 13/022 |
| 2024/0125424 A1* | 4/2024 | Ramachanthiran | H05K 5/0234 |

* cited by examiner

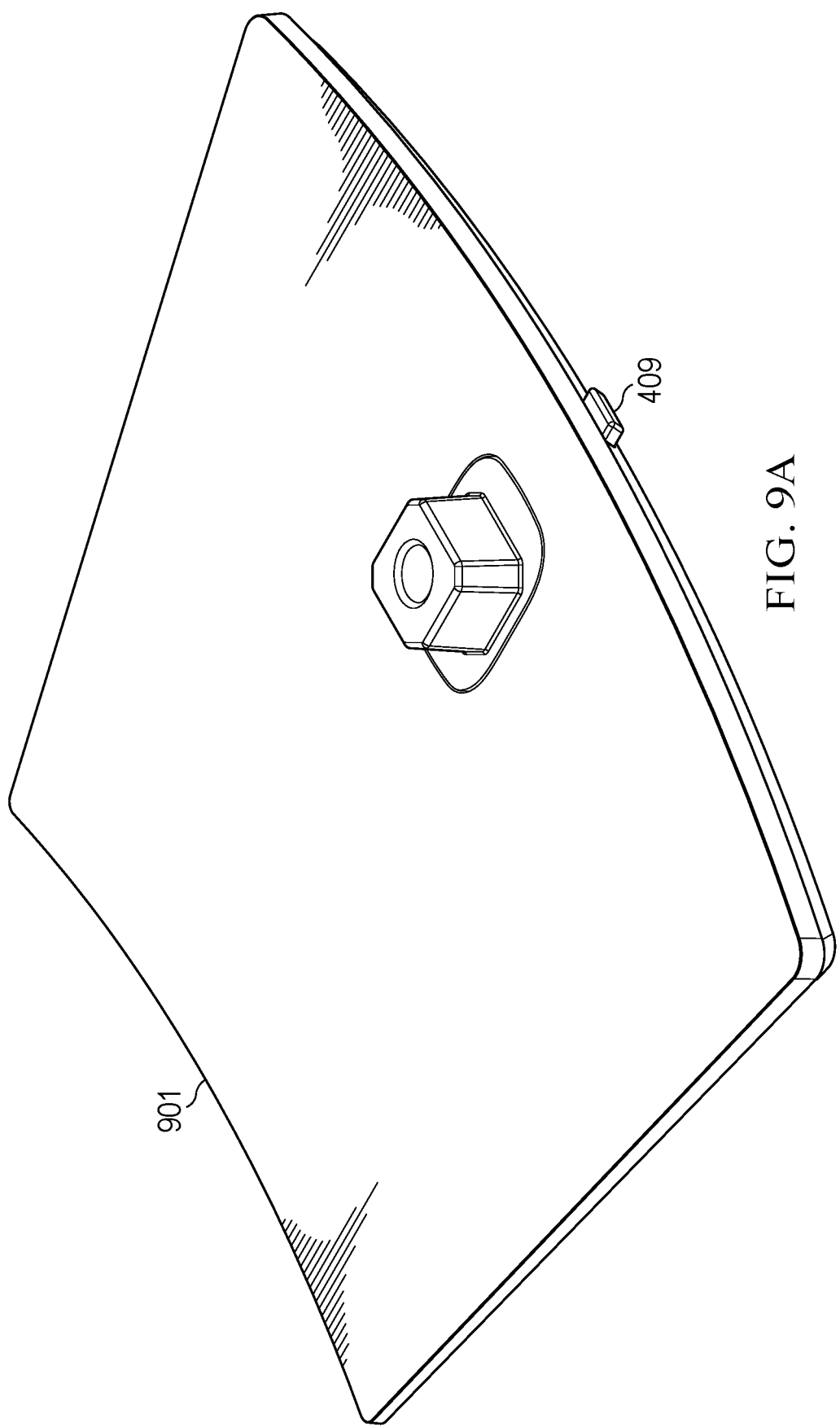

SELF-ALIGNING AND SELF-ORIENTATING SWIVEL LOCK MECHANISM FOR DESKTOP MONITORS

BACKGROUND OF THE INVENTION

Field of the Invention

The present invention relates in general to the field of information handling systems and more particularly to an information handling system swivel lock mechanism for desktop monitors.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems integrate processing components and interface with a display and input devices to interact with end users. Generally, information handling systems have stationary housings, such as desktop and tower systems, or portable housings, such as convertible and tablet systems. Portable information handling systems allow end users to carry a system between meetings, during travel, and between home and office locations so that an end user has access to processing capabilities while mobile. Portable information handling systems typically integrate processing components, a display, a keyboard and a power source within a portable housing to support mobile use. In contrast, stationary systems rely on a fixed power source, such as an outlet, and peripheral devices, such as a separate keyboard and display interfaced by cables or a wireless protocol. Although portable systems have integrated input/output devices, in many instances portable systems are also used with peripheral input and output devices at fixed locations, such as through a docking station. Typically, peripheral devices couple to an information handling system with a cable or wireless interface so that the information handling system is available to aid the end user configuration of the peripheral devices, such as by providing instructions at the display regarding how to configure the peripheral devices. As long as the information handling system is interfaced with the peripheral device, instructions executing on the information handling system can aid the end user.

FIG. 1 illustrates a prior art monitor stand 101 in an upright position. The monitor stand rotates in a clockwise and counterclockwise direction from its center position. FIG. 2 illustrates a bottom view of the monitor stand showing the base rotates clockwise and counterclockwise. While the rotating capability allows a user to adjust the monitor stand to a particular user environment, the rotating capability can result in the monitor being off center, meaning that the stand can rotate more in one direction than another direction. Being off center can arise because a user swivels the stand causing the monitor stand to be displaced from its center position. That can create an impression that the monitor (monitor stand with display attached) is unbalanced or somehow defective since the monitor rotates more in one direction than the other. Users could infer the center position of the monitor stand by manually adjusting the swivel base via trial an error. That approach is inefficient and inaccurate. A user could lift the base of the monitor to have visibility into the center position of the swivel base, but that is both impractical and dangerous.

A lack of ability to easily determine the center position for the monitor stand also adds additional cycle time to manufacturing lines as there is a tendency to lose the center position during validation/verification of the monitor assembly on the production floor. Adding requirements for the operator to rotate the monitor back to its center position after testing adds additional cycle time to manufacturing. In addition, operator(s) can forget to set the monitor stand back to its center position (after testing), and prior to packing. Packing the stand "as is" (off center), complemented by shock/vibration during shipment, can result in end users receiving the stand off-centered. When an end user receives an off-centered stand for assembly, a less than ideal out of box experience (OOBE) occurs.

SUMMARY OF THE INVENTION

Therefore, a need has arisen for a system and method that allows easily determining the center position of the monitor stand to provide a better user experience and easier manufacturing. The center position (also referred to as the zero position, home position, or center/home position) is the position at which the monitor can rotate equally in the clockwise or counterclockwise direction In accordance with the present invention, a system and method are provided which substantially reduces the disadvantages and problems associated with not having the ability to easily lock the monitor stand at the center position. In an embodiment an information handling system includes a base of a monitor stand having a first plate and a swivel plate to allow the monitor stand to rotate on the swivel plate. A swivel lock mechanism locks the swivel plate at a predetermined location, e.g., the center position. The swivel lock mechanism travels along a circular guided cam profile on the swivel plate when the swivel lock mechanism is engaged and the monitor stand is rotated. A recessed portion in the circular guided cam profile receives a lock plunger of the swivel lock mechanism to thereby lock the swivel plate at the predetermined location.

In another embodiment a method for locking a monitor stand at a center position of a swivel plate includes causing a lock plunger of a swivel lock mechanism to travel along a circular cam as the monitor stand is being rotated and causing the lock plunger to enter a recessed portion of the circular guided cam profile responsive to the swivel lock mechanism being adjacent to the recessed portion to thereby lock the monitor stand at the center position.

In still another embodiment, a monitor stand includes a die cast plate forming part of a base of the monitor stand and a swivel plate coupled to the die cast plate to allow the monitor stand to rotate. A swivel lock mechanism locks the swivel plate at a center position. The swivel plate includes a circular guided cam profile on which a lock plunger of the swivel lock mechanism travels when the swivel lock mechanism is engaged. A slot formed in the circular guided cam profile receives the lock plunger to lock the swivel plate at the center position. An engagement button engages/disengages the swivel lock mechanism.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 9A depicts the engagement button in the base.

DETAILED DESCRIPTION

A monitor of an information handling system allows a user to view output from the information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
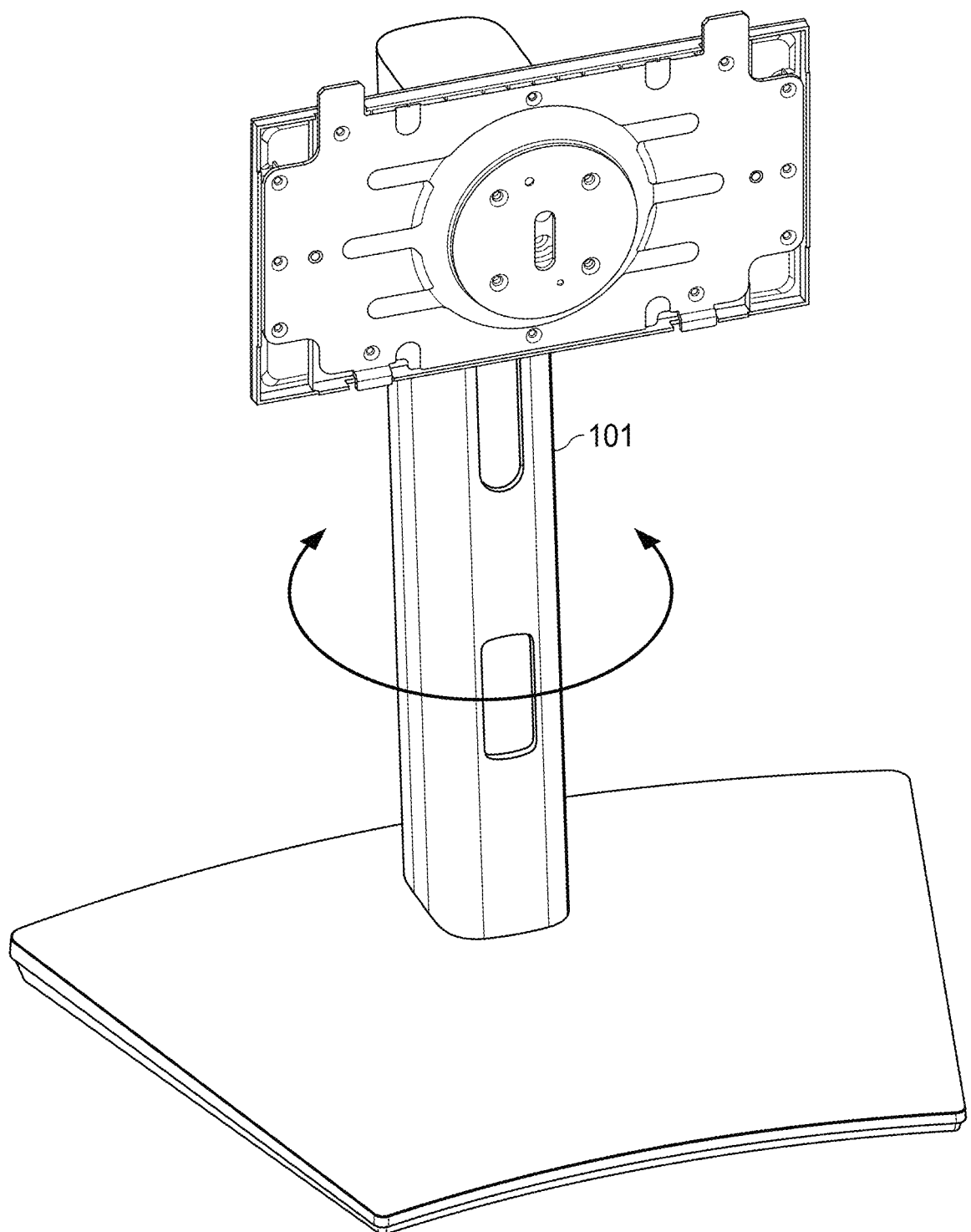
FIG. 1 illustrates a monitor stand that rotates on a swivel mechanism.
Figure 2:
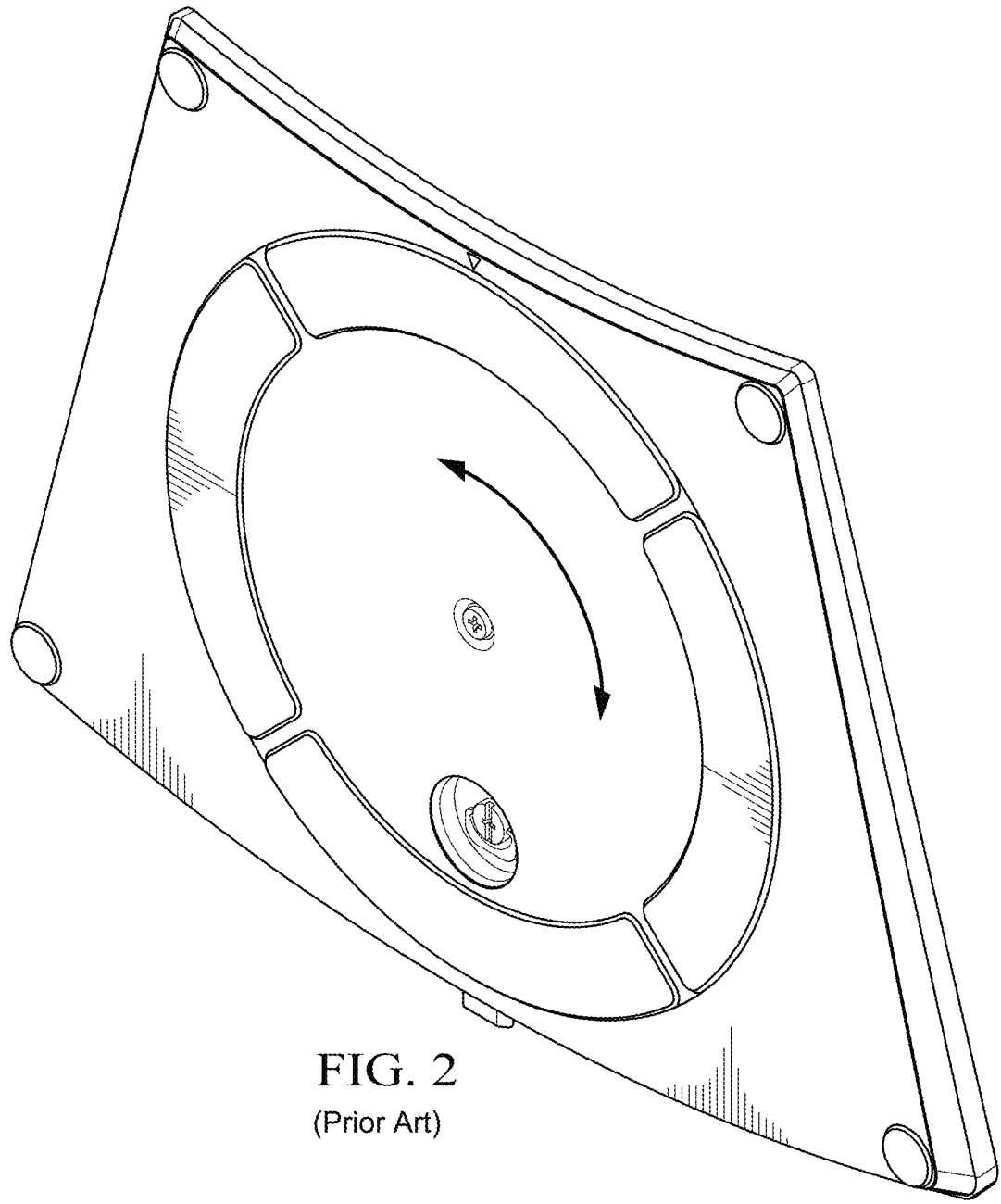
FIG. 2 depicts a bottom view of the monitor stand.
Figure 3:
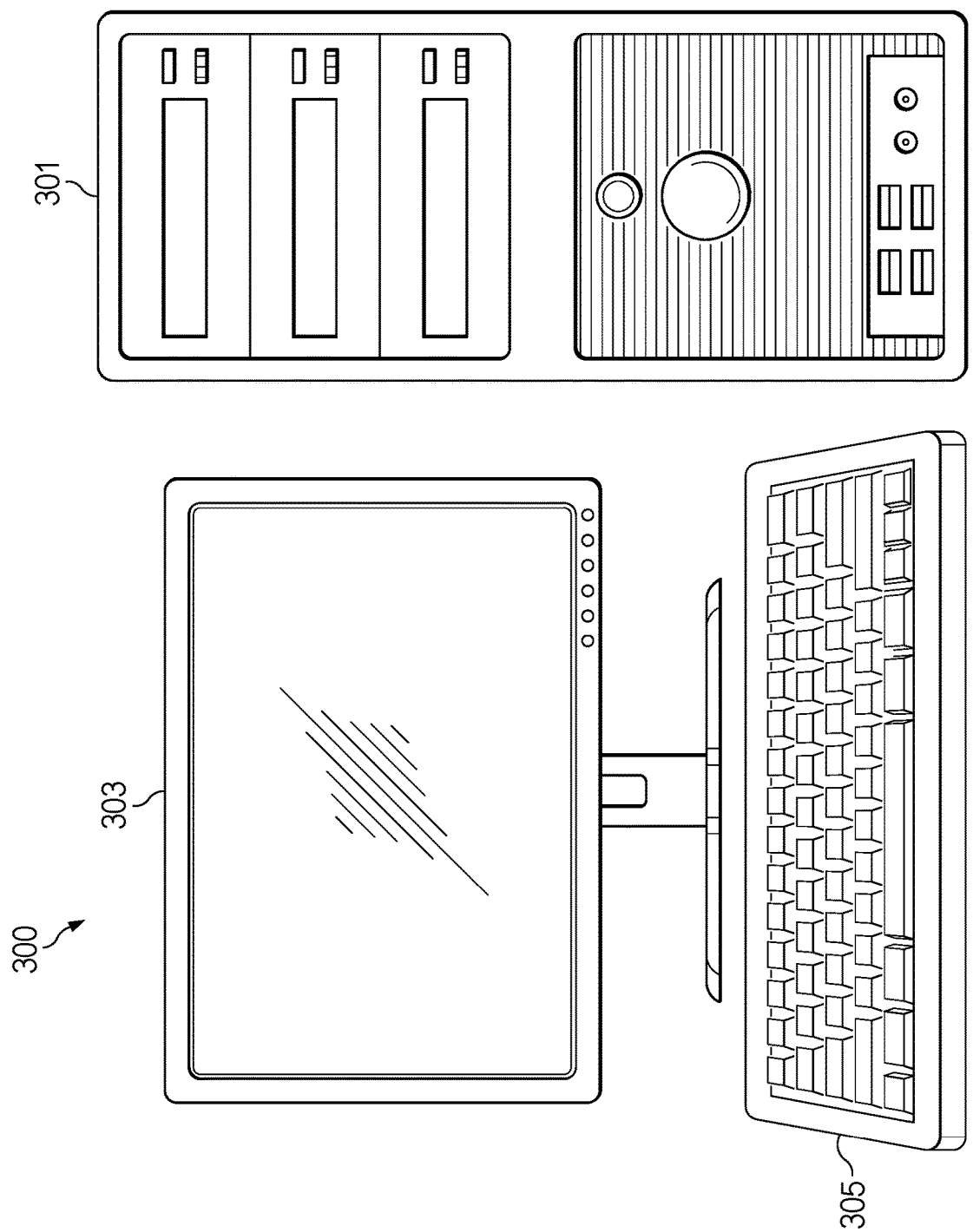
FIG. 3 depicts an information handling system.

FIG. 3 illustrates an exemplary information handling system 300 in a desktop configuration that includes the desktop housing 301 containing the processors, memory, and related electronics, a monitor 303, and a wireless keyboard 305. Without a mechanism to determine and lock the center position, the monitor is free to rotate 350 degrees (or some other predetermined number of degrees) clockwise and counterclockwise from its center position. One approach to lock the monitor in the center position would be to place a simple lever engagement lock at the center/home position accessible from the underneath of the base of the monitor stand. However, that would require the user to lift the monitor base to engage the lock. Requiring a user to lift the monitor to access the base is impractical and dangerous.

Figure 4A:
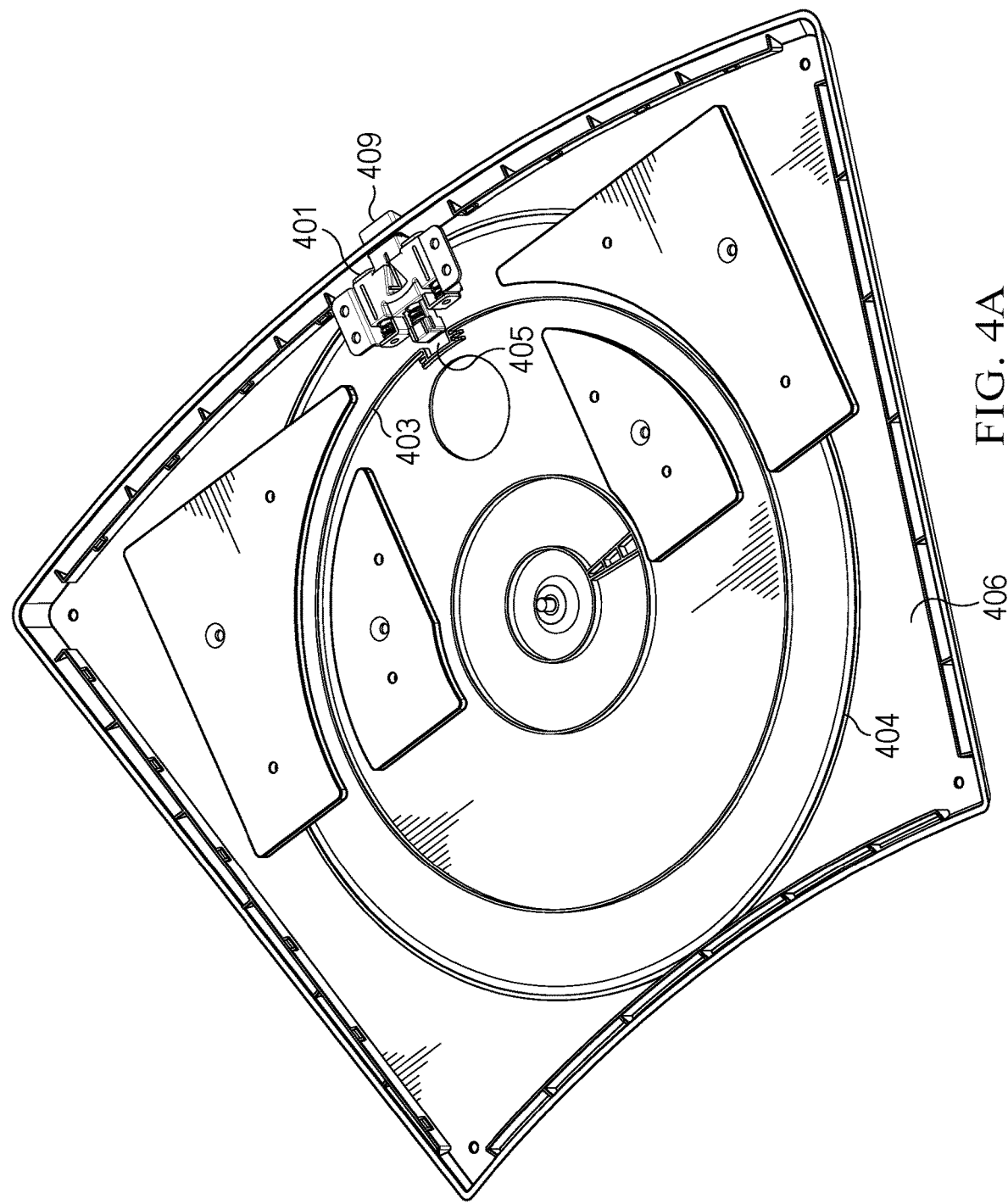
FIG. 4A depicts a base of monitor stand that includes a swivel lock mechanism.
Figure 4B:
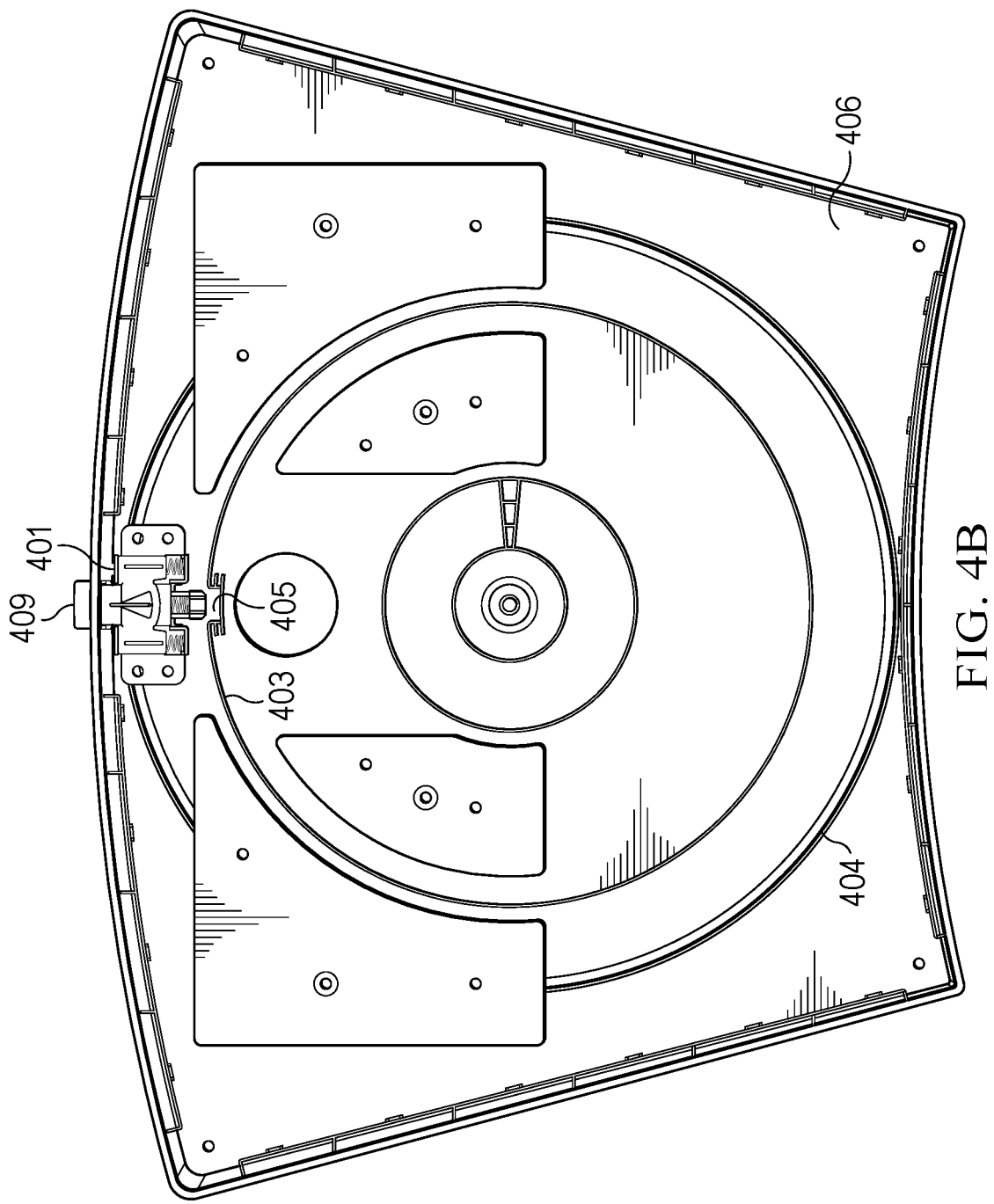
FIG. 4B depicts a top view of a base of monitor stand that includes a swivel lock mechanism.

For monitors having a screen size larger than 43 inches, embodiments use a lazy Susan swivel mechanism in order to optimize the monitor stand base size by maintaining the monitor's center-of-gravity when rotating. FIG. 4A illustrates an embodiment of a swivel lock mechanism 401 that allows a user to easily determine the center position and lock the monitor stand at the center position. The swivel lock approach illustrated in FIG. 4 is self-aligning and self-orientating. FIG. 4A shows a swivel plate 404 mounted with a die cast plate 406. The swivel lock mechanism 401 is aided by a circular guided cam profile 403 formed on the swivel plate 404. FIG. 4B illustrates a top view of the swivel plate 404 and the die cast plate 406. The swivel lock mechanism is engaged/disengaged by the user pushing the engagement button 409.

Figure 5A:
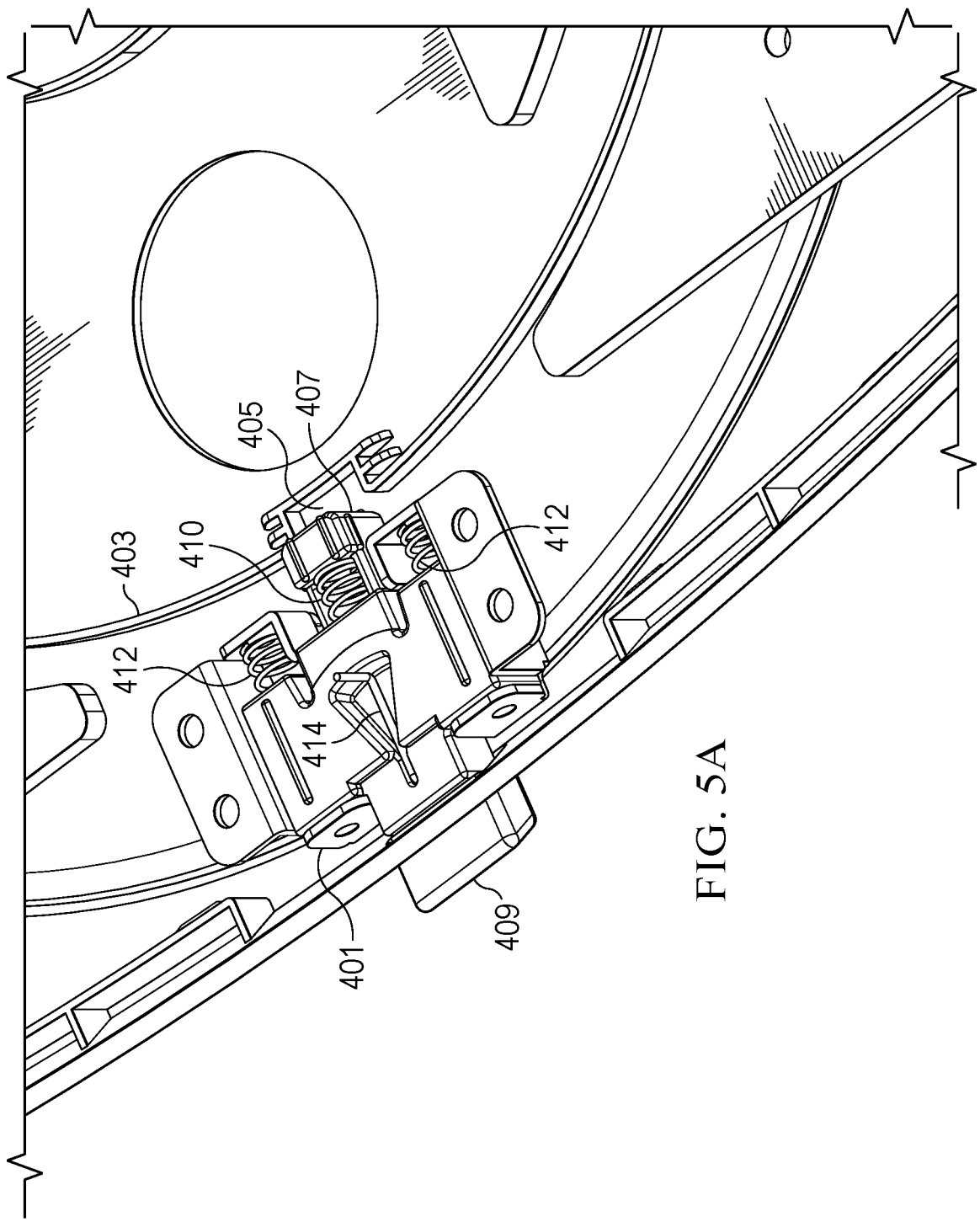
FIG. 5A depicts a more detailed view of the swivel lock mechanism.
Figure 5B:
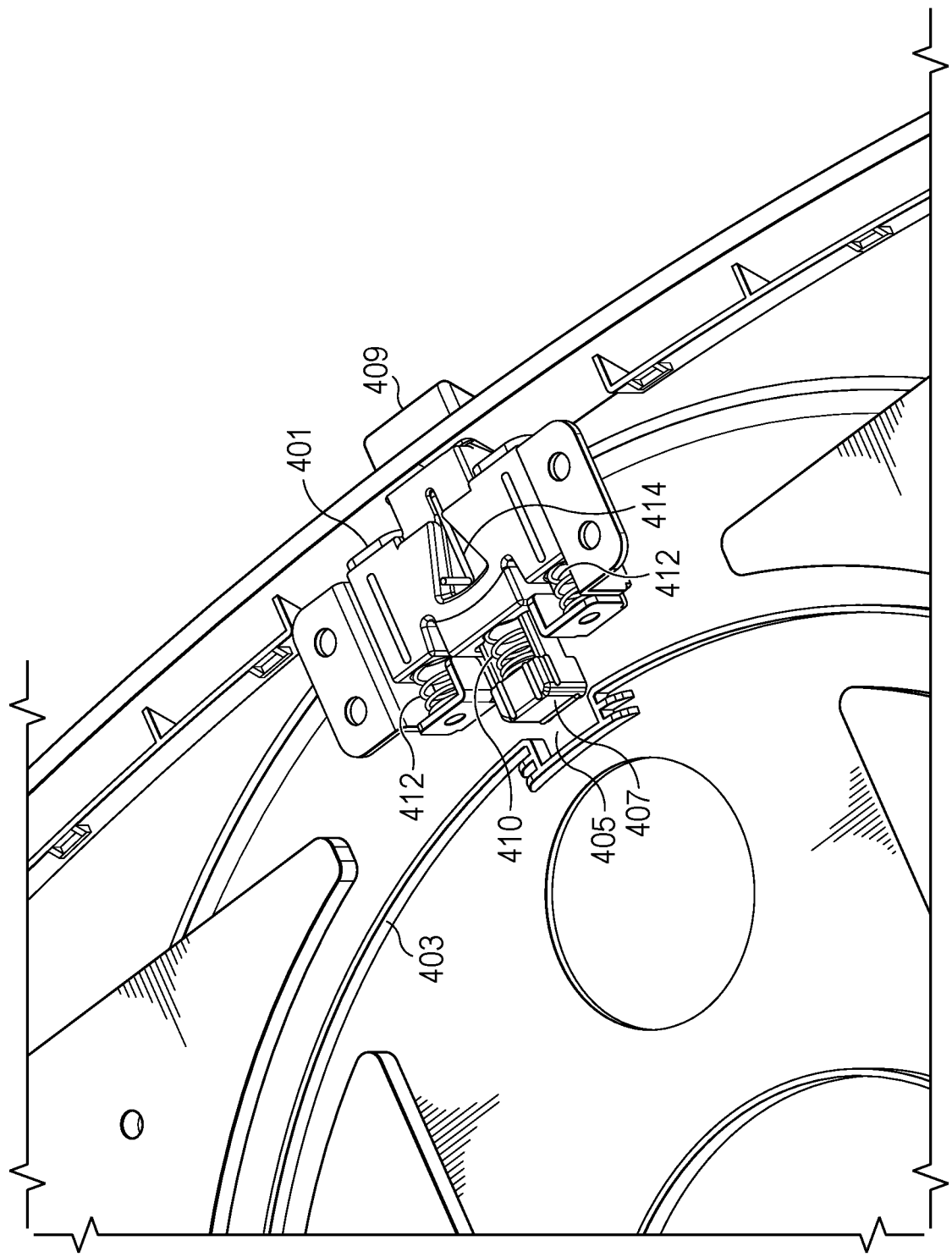
FIG. 5B depicts another view of the swivel lock mechanism.
Figure 5C:
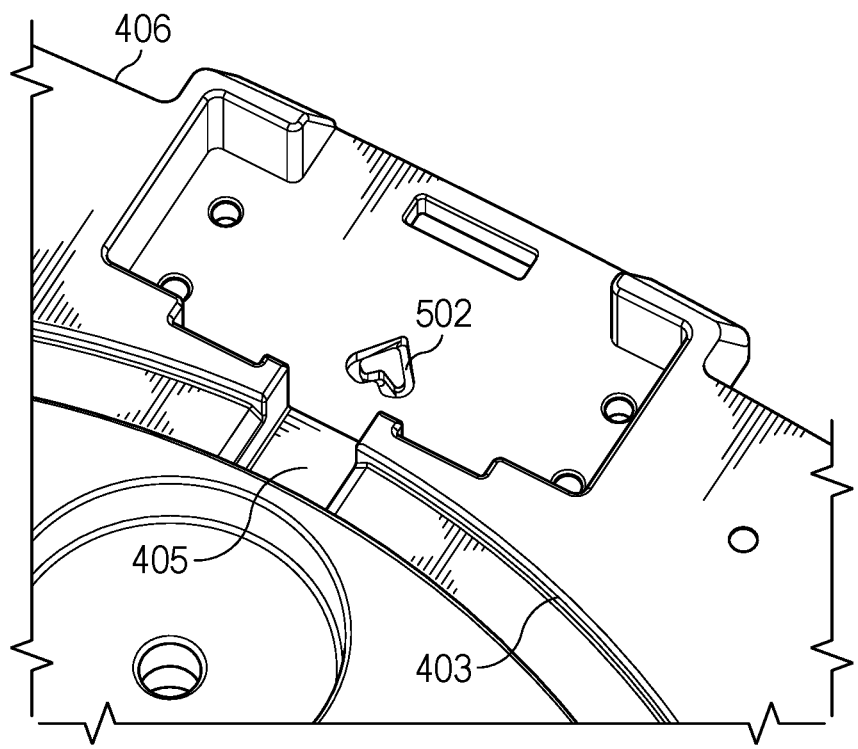
FIG. 5C shows the separate cam profile formed in the die cast plate.

FIG. 5A illustrates the swivel lock mechanism in greater detail. The guided cam profile 403 includes a recessed portion (lock slot) 405, which receives the lock plunger 407 when the swivel lock mechanism is engaged by the user (by pushing engagement button 409) and the swivel lock mechanism rotates along the cam profile 403 until the lock plunger is aligned with and engages the lock slot 405. To disengage the swivel lock mechanism, the user pushes the engagement button 409 again. The swivel lock mechanism includes springs 410 and 412 and spring arm 414 whose functions are described below. FIG. 5B shows another view of the swivel lock mechanism 401 including the engagement button 409, the circular guided cam profile 403 with the lock slot 405. Springs 412 engage and disengage the swivel lock mechanism body structure using a dedicated CAM profile. FIG. 5C shows the cam profile 502 formed in the die cast plate 406.

Figure 5D:
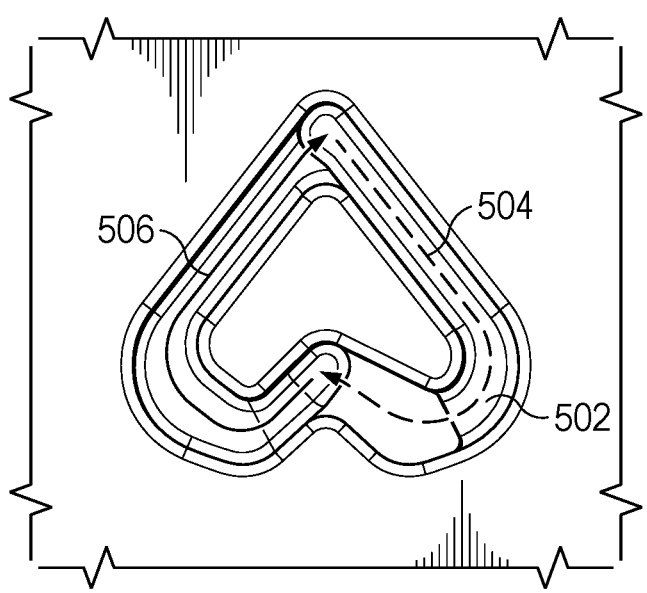
FIG. 5D shows the separate cam profile in greater detail.
Figure 6:
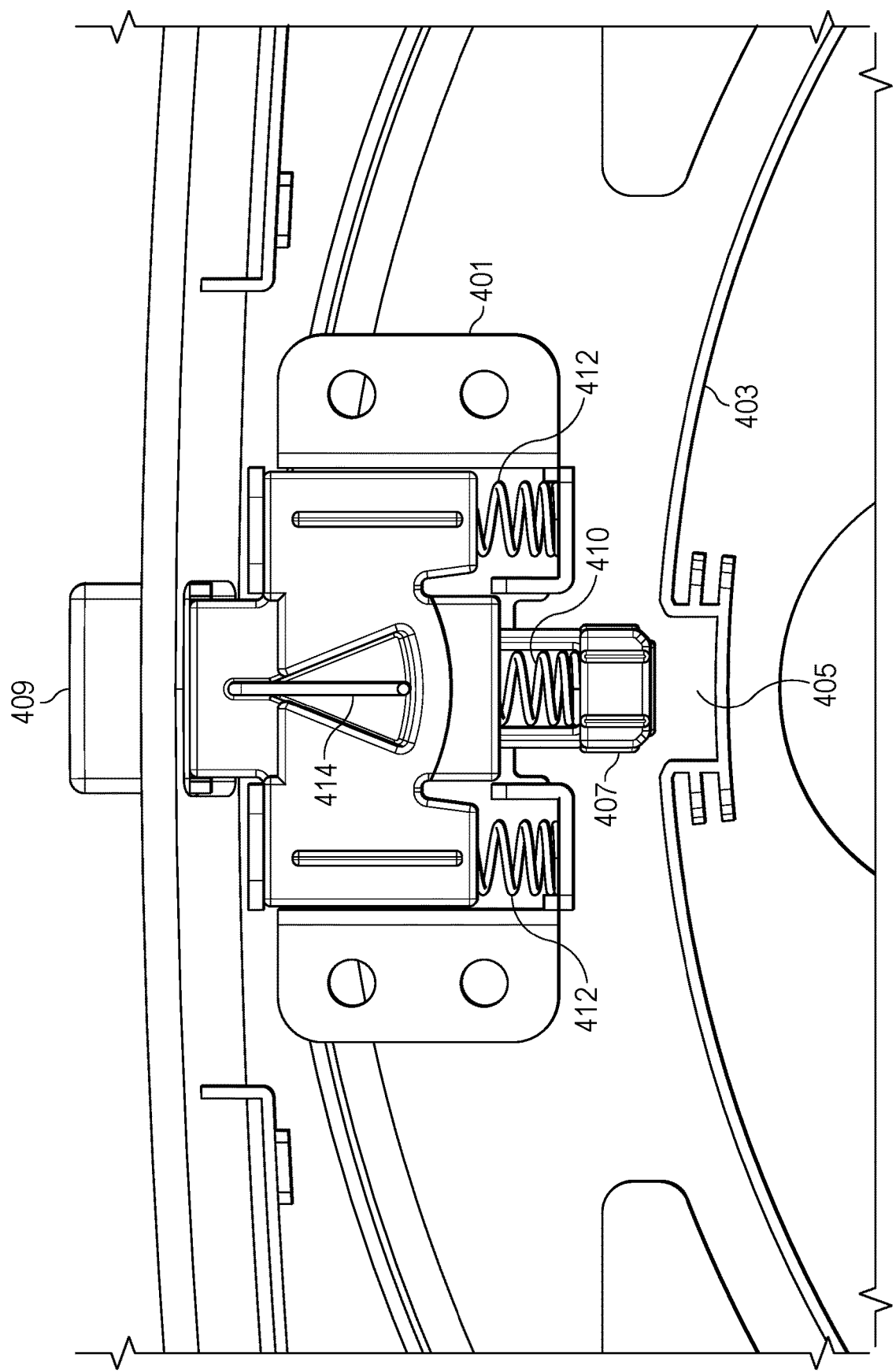
FIG. 6 depicts a top view of the swivel lock mechanism and guided cam profile with a lock slot.

The spring arm rides on the cam profile 406 to allow the lock plunger to engage forward into the activation zone when the engagement button is pressed. When the engagement button 409 is pressed from a disengaged position (see FIG. 5B), the spring arm 414 follows the path 504 to cause the lock plunger to enter a forward position (activation zone). In the activation zone the spring 410 exerts a spring force on the lock plunger causing it to engage the circular cam profile 403 (or detent profile shown in FIG. 8) and when aligned with the lock slot to enter the lock slot 405 and lock the monitor base at the center position. Referring again to FIG. 5D, when the user disengages the swivel lock mechanism by again pushing the engagement button 409 when the mechanism is engaged, the spring arm 414 follows path 506 to cause swivel lock mechanism to move backward resulting in the lock plunger moving backward into the non-activation zone in which the lock plunger no longer can lock the monitor at the center position. In the non-activation zone the lock plunger retracts from the circular guided cam profile such that the monitor can be rotated without the lock plunger engaging the circular guided cam profile 403. The user can engage the swivel lock mechanism anywhere along the circular guided cam profile and the tip of the lock plunger engages with the circular guided cam profile as the monitor is rotated back to the center position at which point the lock plunger 407 enters the lock slot 405. In an embodiment, from the center/home position the swivel plate is free to rotate 175° clockwise, and 175° counter-clockwise. Of course, in other embodiments the freedom to rotate may be some other amount, e.g., 160° in either direction or some other desired degree of rotation. FIG. 6 shows a top view of the swivel lock mechanism 401 and cam profile 403. When the lock plunger 407 engages the lock slot 405, tactile feedback is provided back to the user and a soft audible "click" occurs as the lock plunger sinks into the lock slot 405 as the swivel lock mechanism locks the monitor stand into the center/home position. The spring arm 414 rides on the cam profile 502 shown in FIGS. 5C and 5D and responds to the user pushing the engagement button to engage/disengage the swivel lock mechanism and thereby move the lock plunger into/out of the activation zone.

Figure 7A:
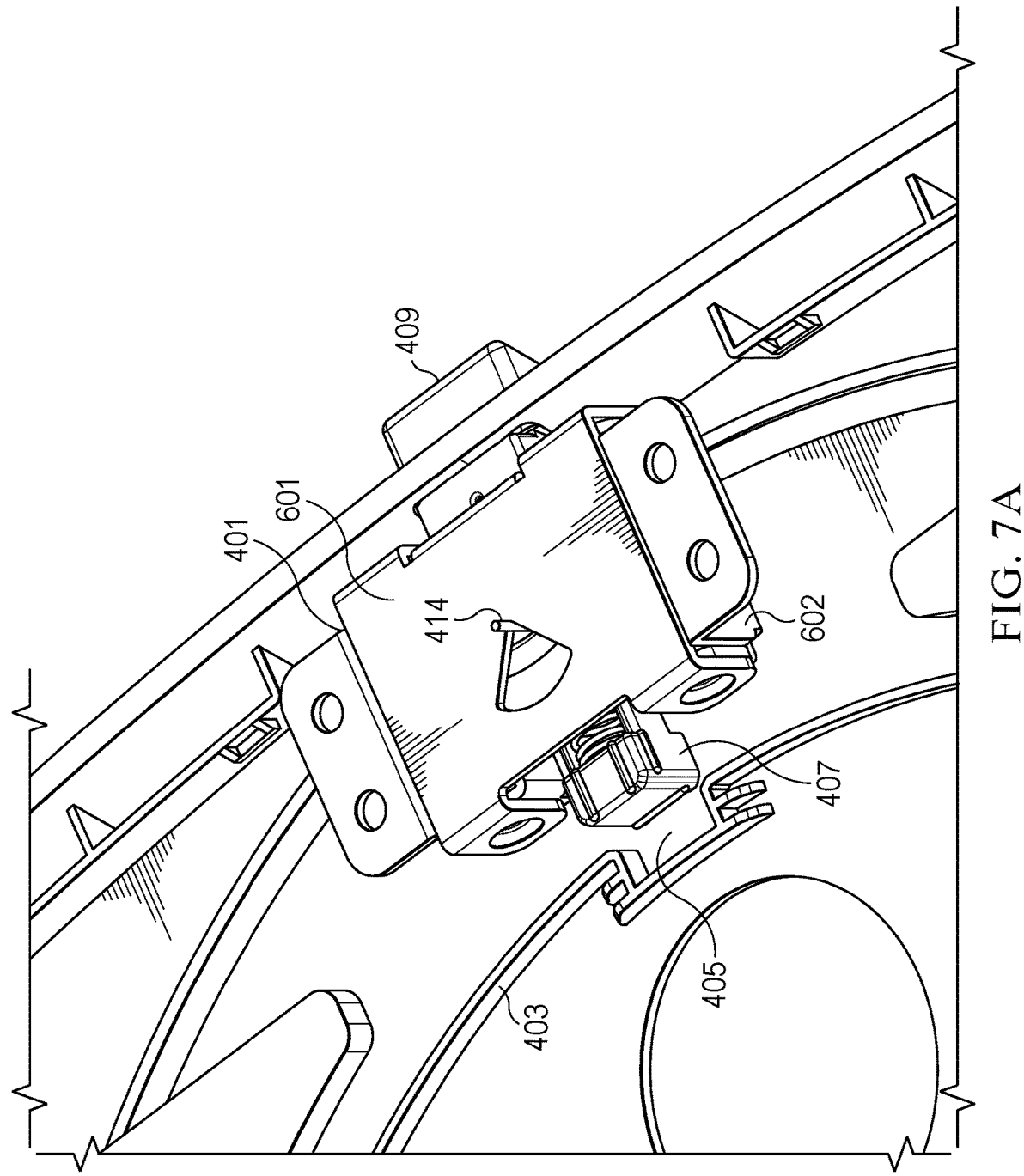
FIG. 7A depicts a swivel lock mechanism with a cover and the guided cam profile with a lock slot.
Figure 7B:
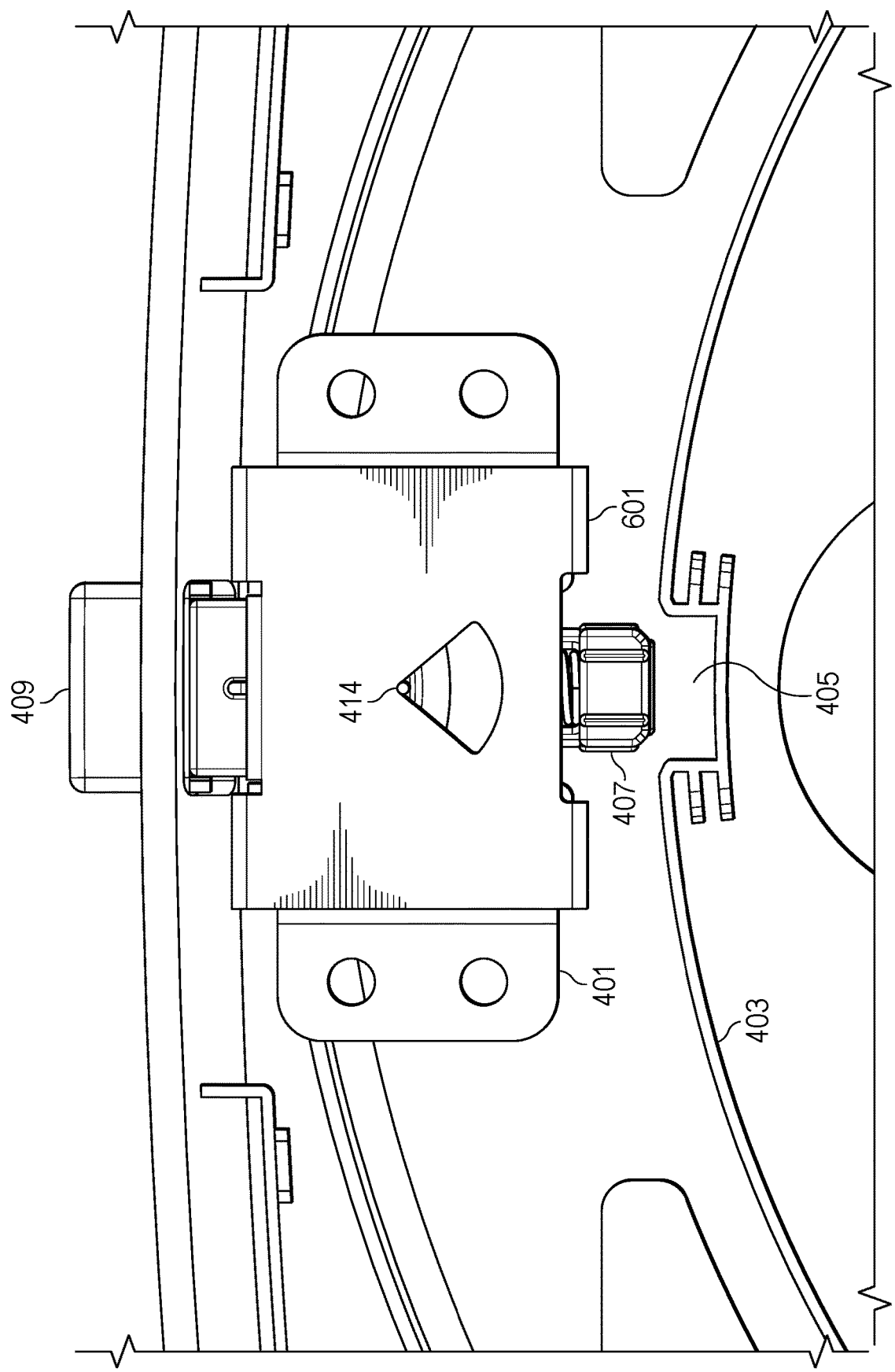
FIG. 7B depicts a top view of the swivel lock mechanism with cover and the guided cam profile with a lock slot.
Figure 7C:
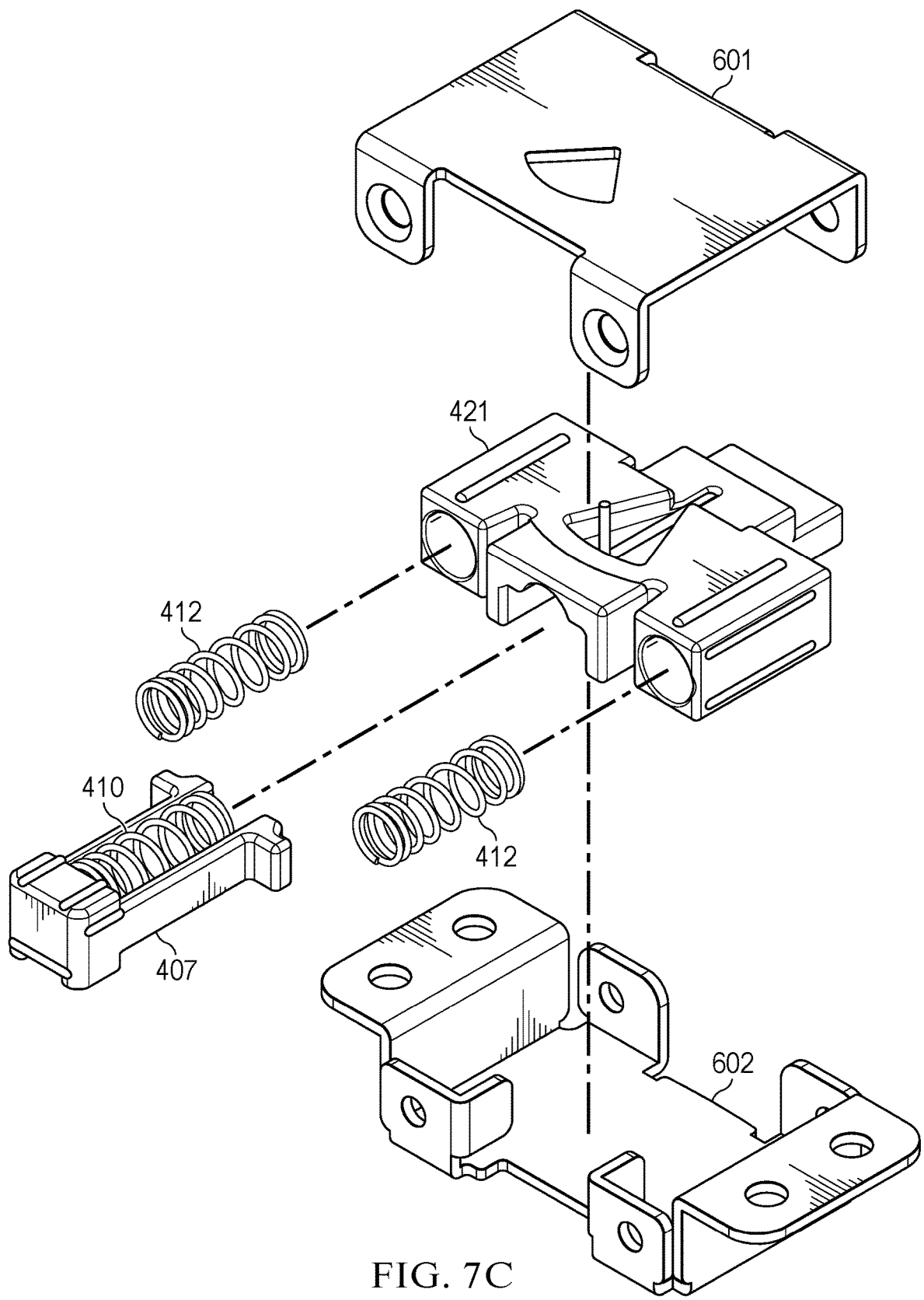
FIG. 7C shows the separate components of the swivel lock mechanism.

FIG. 7A shows an embodiment in which the swivel lock mechanism 401 includes a cover plate 601 and a bottom plate 602. FIG. 7B shows a top view of the swivel lock mechanism with the cover plate 601. FIG. 7C shows the separate components of the swivel lock mechanism 401 including the engagement button body 421 with spring arm 414, the springs 412 which are assembled into the engagement button body, the bottom plate 602 and the cover plate 601.

Figure 8:
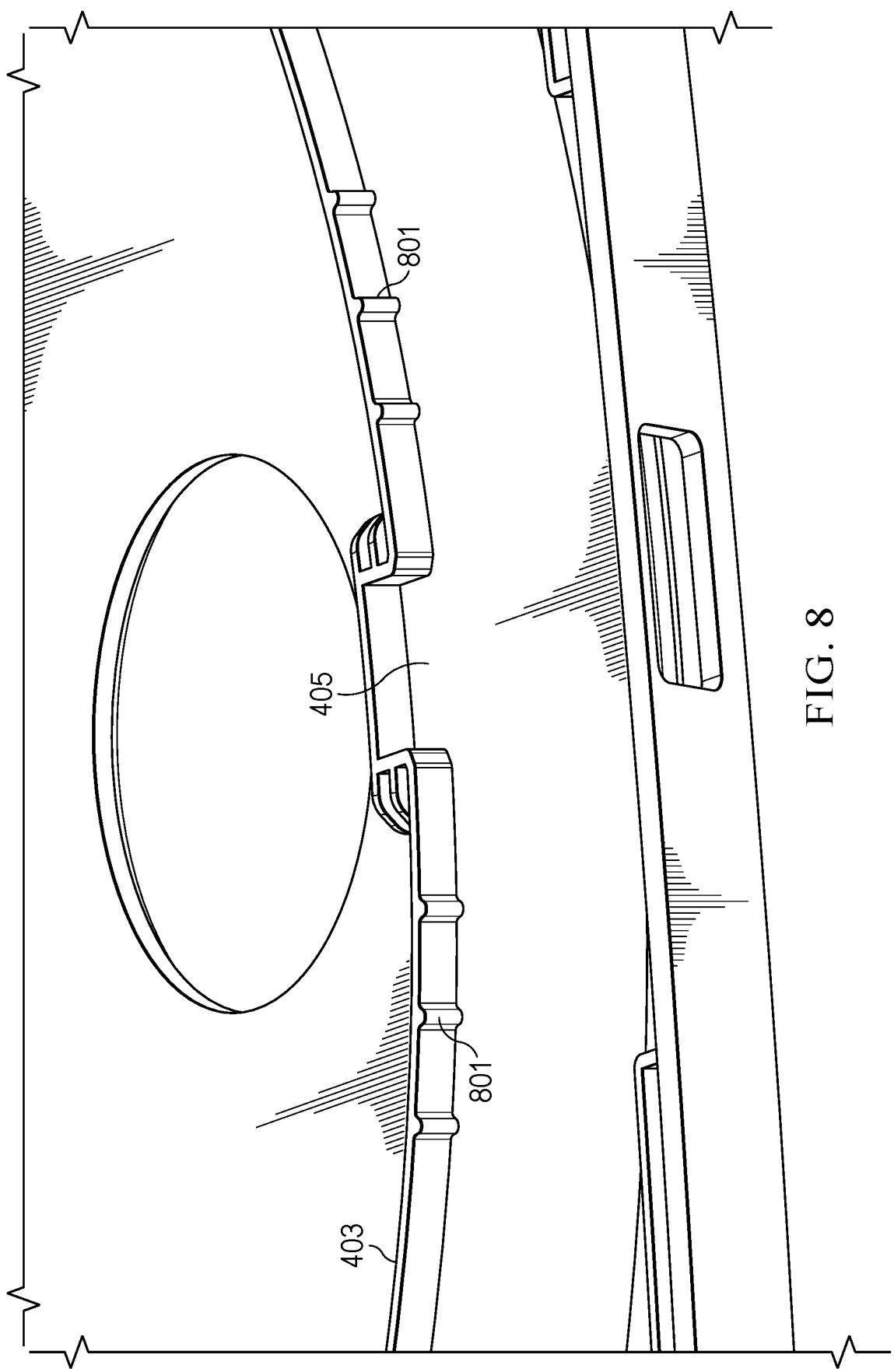
FIG. 8 depicts a circular guided cam profile with additional detents to provide additional tactile feedback at the location of the additional detents.

FIG. 8 shows an embodiment in which additional detents 801 are provided along the circular guided cam profile 403 on either side of the lock slot 405 to provide additional tactile feedback to indicate to the user that the swivel lock mechanism is approaching the center/home position. Alternatively, or in addition, the additional detents can be added to indicate another position along the circular guided cam profile, e.g., ±45° or ±90°.

Figure 9B:
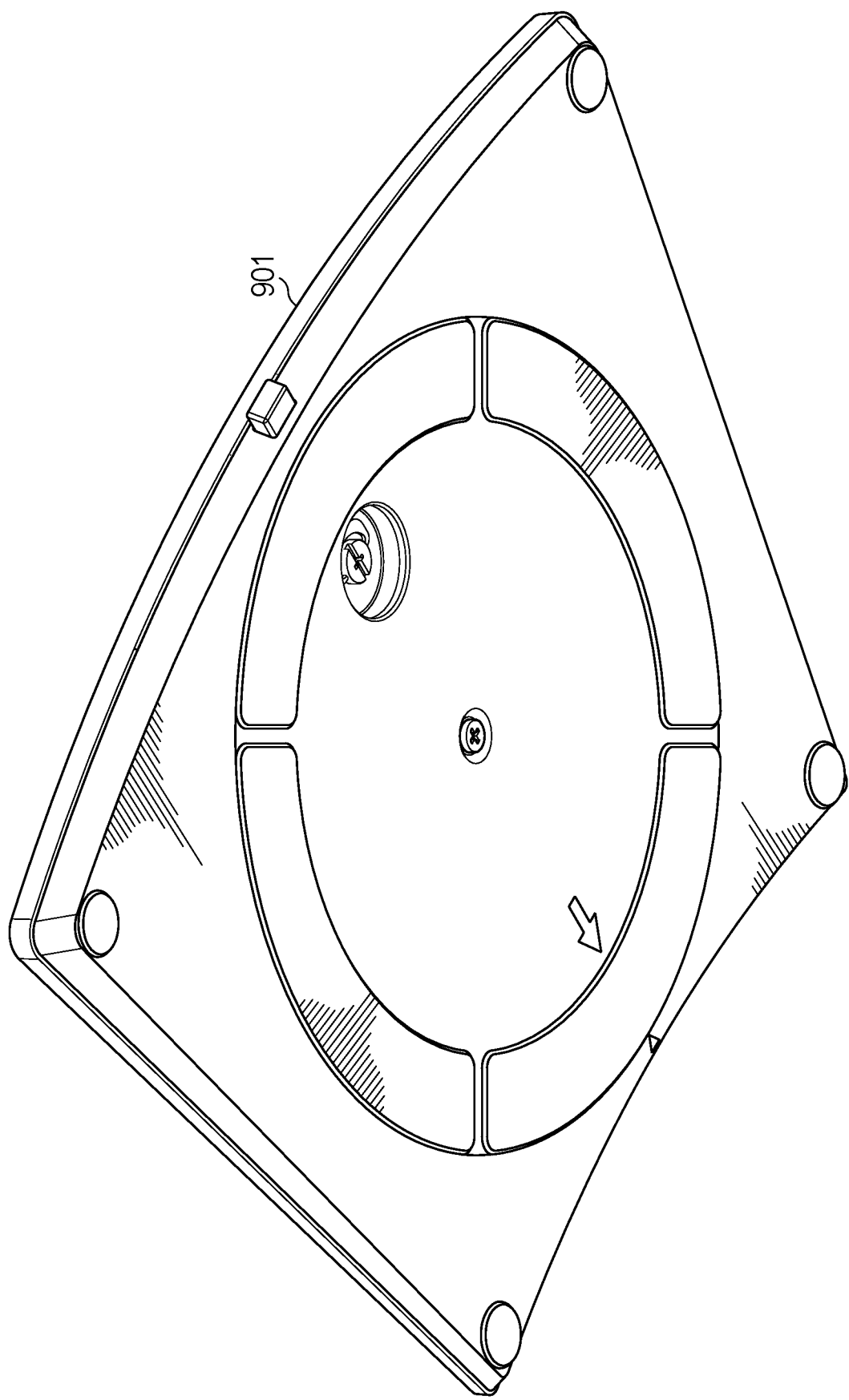
FIG. 9B depicts another view of the engagement button in the base.

FIG. 9A illustrates the top side of the base plate 901 that shows the engagement button 409 and FIG. 9B show the bottom of the base plate 901 with the engagement button 409. The engagement button 409 is placed so it is readily accessible to the user allowing the monitor to be easily locked into the center/home position during manufacturing or by an end user.

Figure 10:
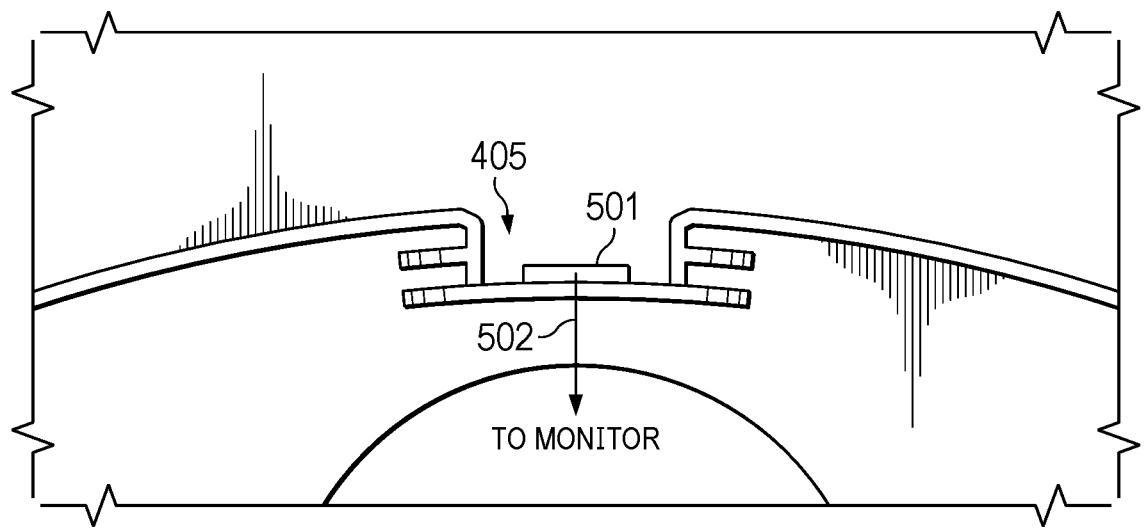
FIG. 10 depicts an embodiment with a sensor in the lock slot.
Figure 11:
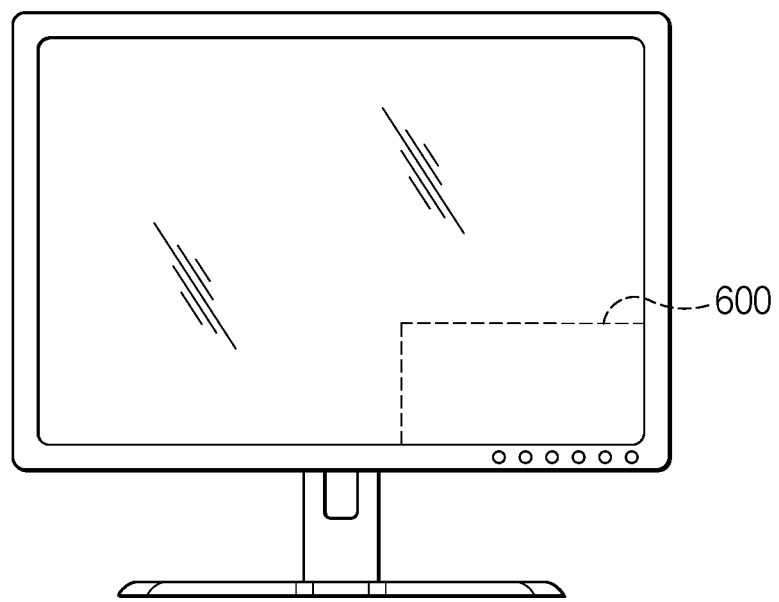
FIG. 11 depicts an embodiment in which the locked/unlocked status is displayed on a screen of the monitor.

In an embodiment, shown in FIG. 10, the slot 405 includes a sensor, e.g., a switch 501, that is activated when the monitor stand is locked into the home/center position. The switch 501 is closed (or opened depending on the design) when the lock plunger engages the lock slot. The power/ground connections of switch (or other sensor) 501 are not shown for ease of illustration. The position of the switch (open/closed) using, e.g., a high logical voltage or low logical voltage, is conveyed via wire 502 to logic in the monitor. In an embodiment illustrated in FIG. 11, the region 600 of the monitor monitors whether the monitor is in the center lock position along with other monitor information such as brightness, contrast, etc.

Figure 12:
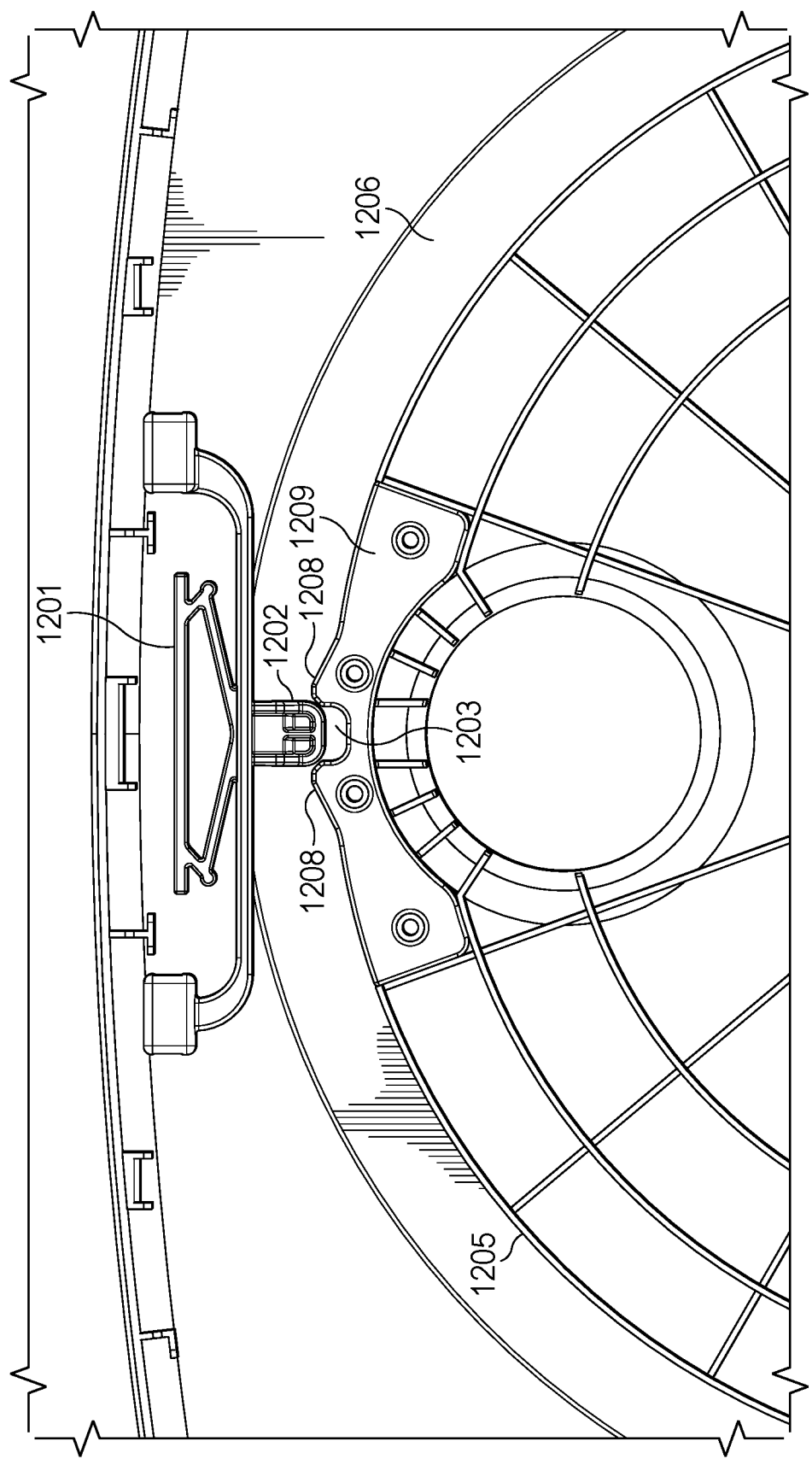
FIG. 12 depicts another embodiment of a swivel lock mechanism for a monitor stand.

FIG. 12 shows another embodiment of a swivel lock mechanism 1200 in which a spring 1201 causes the lock plunger 1202 to engage in the recessed portion 1203 of the circular guided cam profile 1205 on the swivel plate 1206 when the swivel lock mechanism is rotated to the recessed portion 1203. In an embodiment spring 1201 is formed of polyoxymethylene (POM). Of course, other materials can be used for the spring. The circular guided cam profile 1205 includes raised profile portions 1208. In an embodiment a support structure 1209 reinforces the circular guided cam profile 1205 around the raised profile portions 1208 and the recessed portion 1203. In the embodiment shown in FIG. 12, instead of a user pushing an engage/disengage button and then rotating the monitor stand, the user rotates the stand into and out of the home position. The user can tell the monitor is in the home position as the force required to rotate the monitor is significantly higher when in the home position than at another position along the circular guided cam profile. The spring 1201 flexes to overcome the raised profile 1208 and the lock plunger creates a tactile feedback as it enters the lock slot 1203.

Figure 13:
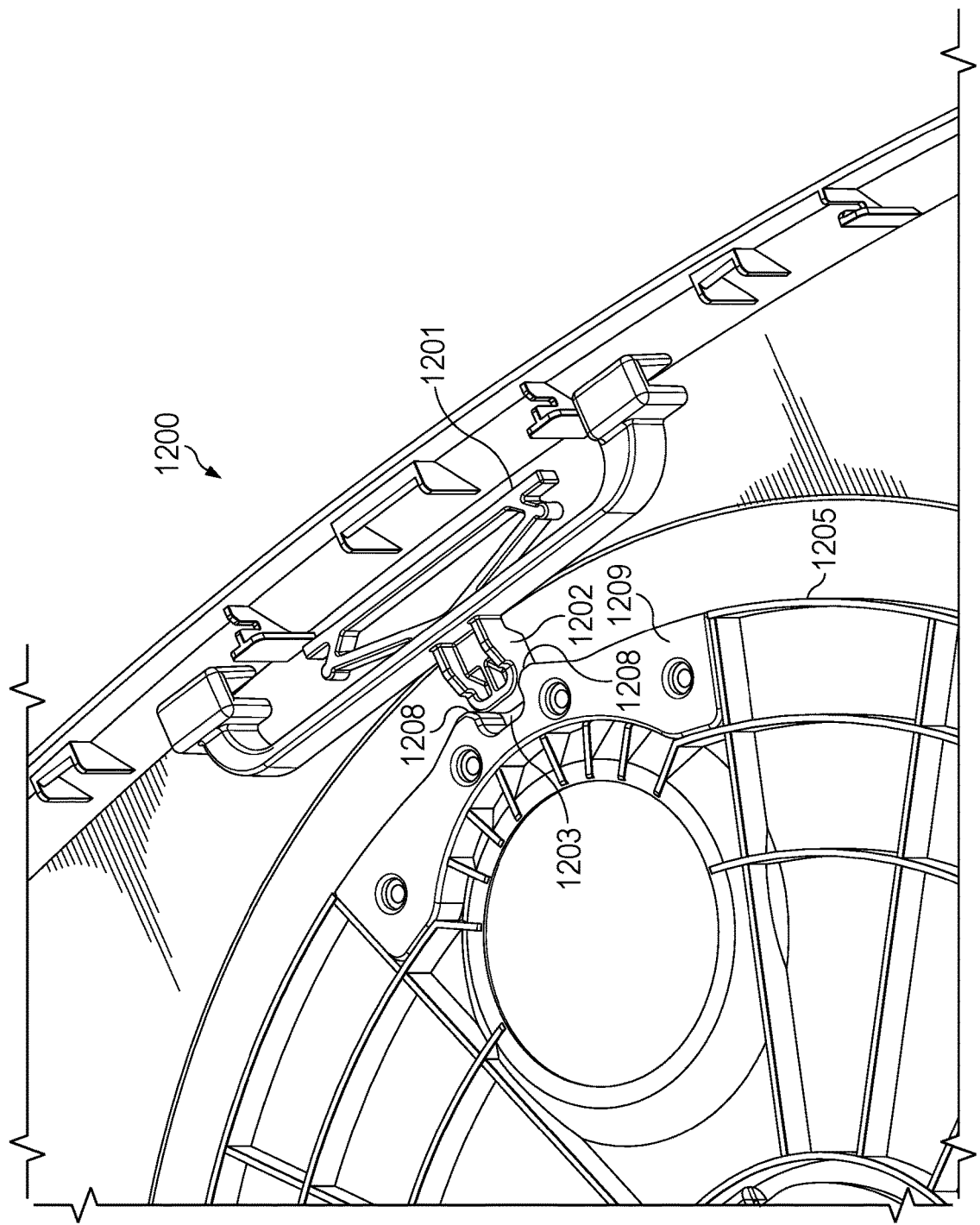
FIG. 13 depicts another view of the swivel lock mechanism for a monitor stand.
Figure 14:
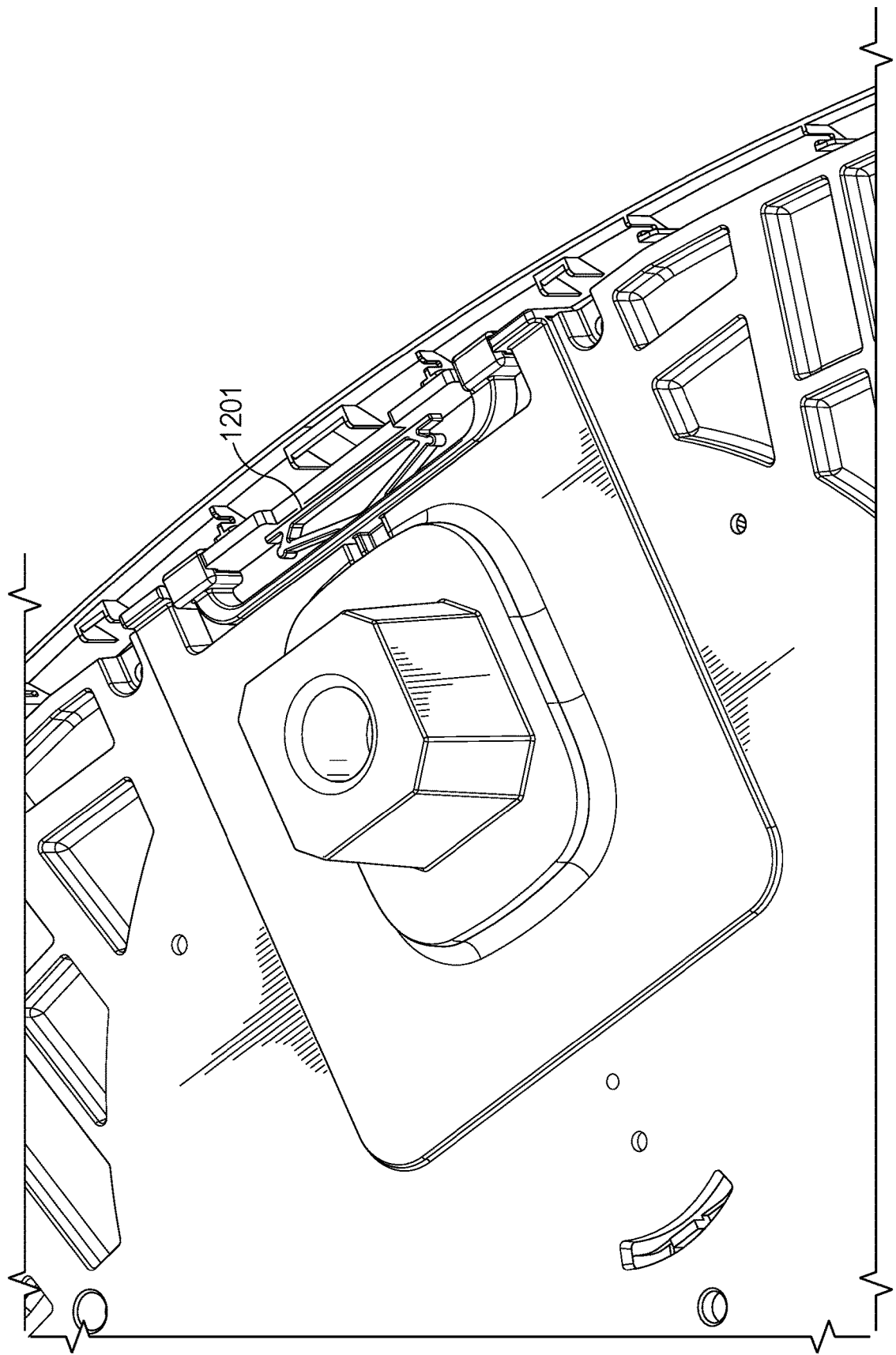
FIG. 14 shows another view of the swivel lock mechanism with additional components of the monitor stand base.
Figure 15:
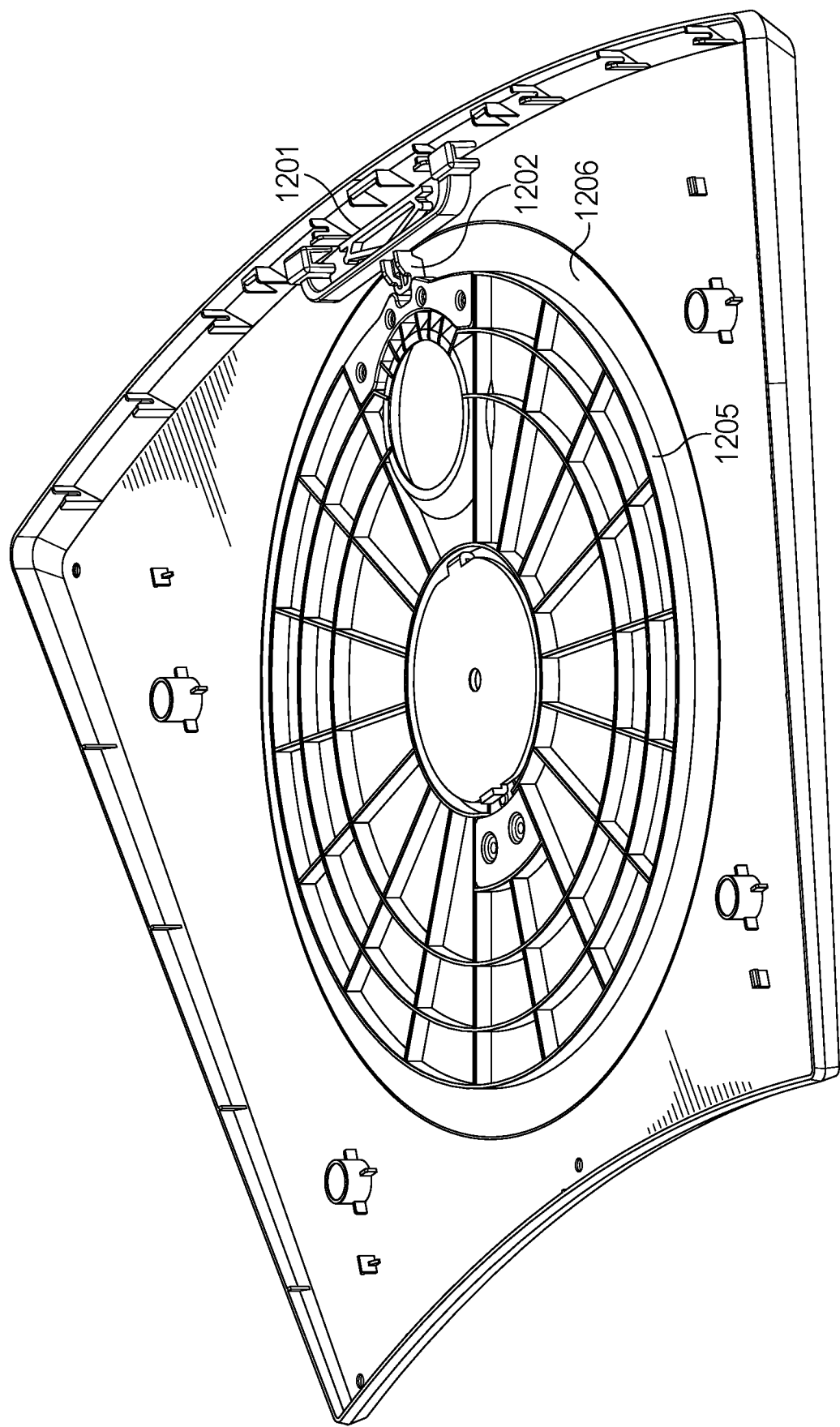
FIG. 15 shows a view of the monitor stand base showing the circular guided cam profile on the swivel plate, the spring, and the lock plunger.

FIG. 13 shows another view of the swivel lock mechanism 1200 that includes the spring 1201, the lock plunger 1202 that is forced into contact with the circular guided cam profile 1205 and into the recess 1203 when properly aligned by the spring 1201. FIG. 13 also shows the support structure 1209. FIG. 14 shows another view of the swivel lock mechanism with additional components of the monitor stand base. FIG. 15 shows a view of the monitor stand base showing the circular guided cam profile 1205 on the swivel plate 1206, the spring 1201, and the lock plunger 1202.

Figure 16:
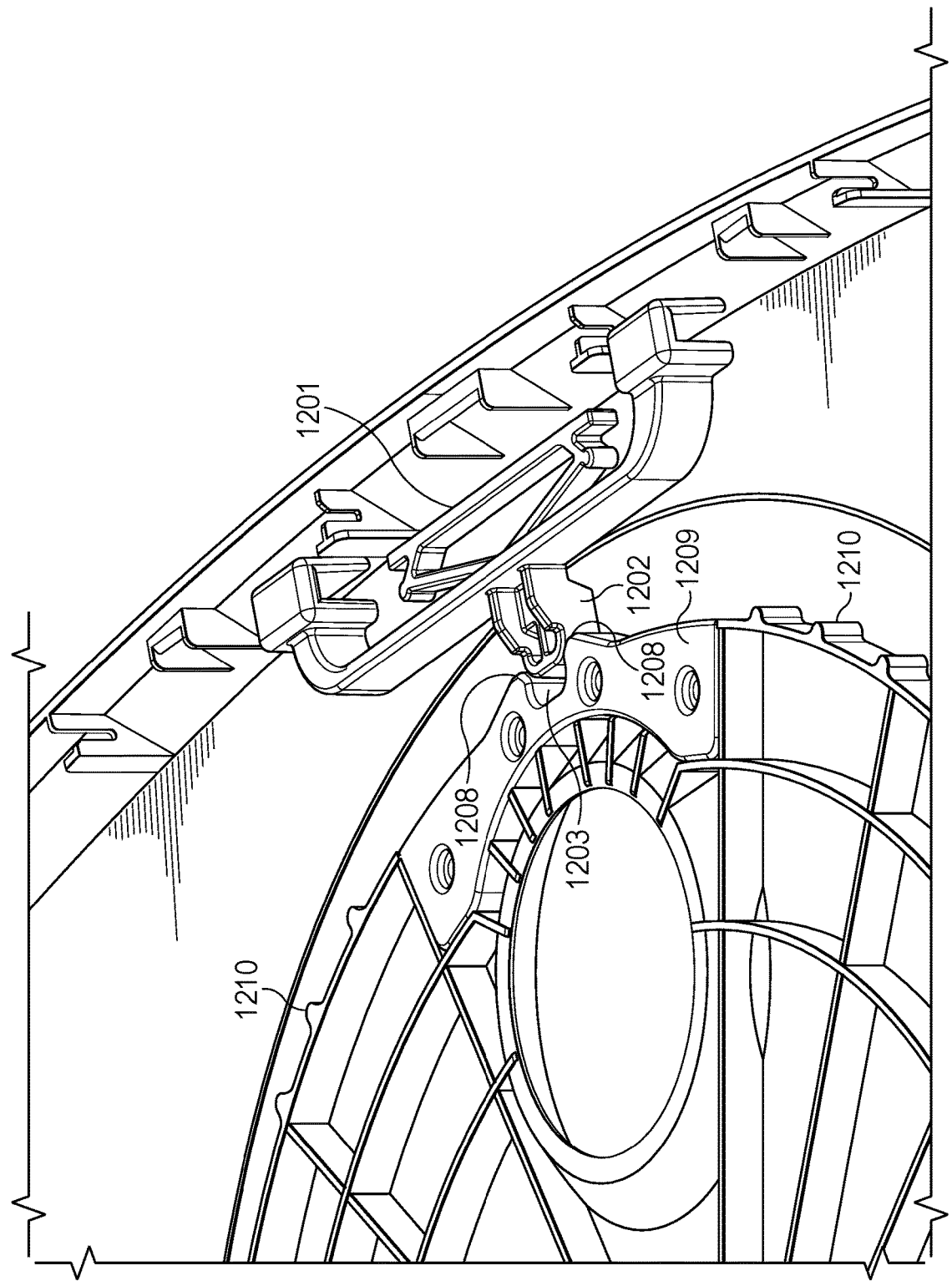
FIG. 16 illustrates an embodiment having additional detents on the circular guided cam profile to provide additional tactile feedback to a user at the detent positions.

FIG. 16 illustrates an embodiment having additional detents at 1210 along the circular guided cam profile to provide additional tactile feed to a user at those detent positions. Those detent positions may indicate a particular rotation of the monitor stand, e.g., ±45° or ±90°, or may indicate to a user that the user is approaching or rotating away from the home position.

Thus, various aspects have been described related to a monitor stand that can be easily locked into a center position by a user. The description of the invention set forth herein is illustrative and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An information handling system comprising:
    a base of a monitor stand, the base including a first plate and a swivel plate that is rotatable with respect to the first plate;
    a swivel lock mechanism to lock the swivel plate at a predetermined location with respect to the first plate;
    a circular guided cam profile on the swivel plate;

a lock plunger of the swivel lock mechanism, the lock plunger being in a forward position when the swivel lock mechanism is engaged;

a recessed portion in the circular guided cam profile to receive the lock plunger of the swivel lock mechanism when the lock plunger is aligned with the recessed portion and the swivel lock mechanism is engaged, the lock plunger entering the recessed portion to thereby lock the swivel plate at the predetermined location; and wherein the lock plunger stays in contact with the circular guided cam profile as the swivel plate is rotated while the swivel lock mechanism is engaged;

wherein the swivel lock mechanism further comprises, a first spring that exerts a force on the lock plunger to force the lock plunger into the forward position when the swivel lock mechanism is engaged;

an engagement button to engage and disengage the swivel lock mechanism, the lock plunger of the swivel lock mechanism being in a rearward position and thereby spaced apart from the circular guided cam profile when the swivel lock mechanism is disengaged;

a second spring and a third spring, the second and third springs configured to exert a force on a body of the swivel lock mechanism to cause the swivel lock mechanism to move backward when the engagement button is pushed while the swivel lock mechanism is engaged, the engagement button being pushed thereby resulting in the swivel lock mechanism becoming disengaged.

2. The information handling system as recited in claim 1 wherein the engagement button extends past the base to provide accessibility.

3. The information handling system as recited in claim 1 wherein the engagement button can be engaged when the swivel lock mechanism is at a location on the circular guided cam profile away from the recessed portion.

4. The information handling system as recited in claim 1 wherein the predetermined location is a center position providing an equal amount of rotation of the swivel plate in each direction from the center position.

5. The information handling system as recited in claim 1 wherein the lock plunger entering the recessed portion provides tactile feedback and audible feedback.

6. The information handling system as recited in claim 1 further comprising detents on the circular guided cam profile to indicate another predetermined location.

7. The information handling system as recited in claim 1 further comprising a sensor to sense when the lock plunger is engaged in the recessed portion.

8. The information handling system as recited in claim 1 wherein the information handling system provides a visual indication of the lock plunger being engaged in the recessed portion on a display of the information handling system.

9. The information handling system of claim 1 wherein the circular guided cam profile is rotatable from a center position by at least 160° in both a clockwise direction and a counterclockwise direction with the swivel lock mechanism engaged and the lock plunger in contact with the guided circular cam profile.

10. The information handling system of claim 1 further comprising:

a spring arm that rides on a cam profile in the first plate and is responsive to the engagement button being pushed to move the spring arm in the cam profile in the first plate to cause the swivel lock mechanism to be engaged or disengaged according to a state of the swivel lock mechanism when the engagement button is pushed.

11. A monitor stand comprising:

a die cast plate forming a part of a base of the monitor stand;

a swivel plate coupled to the die cast plate;

a swivel lock mechanism to lock the swivel plate at a center position with respect to the die cast plate;

a circular guided cam profile on the swivel plate;

a lock plunger of the swivel lock mechanism, the lock plunger configured to be in contact with the circular guided cam profile as the swivel plate is rotated with the lock plunger in a forward position;

a lock slot formed in the circular guided cam profile to receive the lock plunger of the swivel lock mechanism when the lock plunger is in the forward position and the lock plunger is aligned with the lock slot to thereby lock the swivel plate at the center position;

wherein the swivel lock mechanism further comprises, an engagement button to engage and disengage the swivel lock mechanism, the lock plunger being in the forward position when the swivel lock mechanism is engaged and the lock plunger being in a rearward position and thereby spaced apart from the circular guided cam profile when the swivel lock mechanism is disengaged;

a first spring that exerts a force on the lock plunger to force the lock plunger into the forward position when the swivel lock mechanism is engaged; and a second spring and a third spring, the second and third springs configured to exert a force on a body of the swivel lock mechanism to cause the swivel lock mechanism to move backward when the engagement button is pushed while the swivel lock mechanism is engaged, the engagement button being pushed thereby resulting in the swivel lock mechanism becoming disengaged.

12. The monitor stand as recited in claim 11 wherein pushing the engagement button while the swivel lock mechanism is engaged causes the swivel lock mechanism to be disengaged thereby causing the lock plunger of the swivel lock mechanism to be spaced apart from the circular guided cam profile.

13. The monitor stand of claim 11 further comprising:

a spring arm that rides on a cam profile in the die cast plate and is responsive to the engagement button being pushed to move the spring arm in the cam profile to cause the swivel lock mechanism to be engaged or disengaged according to a state of the swivel lock mechanism when the engagement button is pushed.

\* \* \* \* \*